United States Patent
Fernandes et al.

(10) Patent No.: US 11,222,841 B2
(45) Date of Patent: Jan. 11, 2022

(54) STACKED CAPACITOR

(71) Applicant: TEXAS INSTRUMENTS INCORPORATED, Dallas, TX (US)

(72) Inventors: Poornika Fernandes, Murphy, TX (US); Ye Shao, Plano, TX (US); Guruvayurappan S. Mathur, Plano, TX (US); John K. Arch, Richardson, TX (US); Paul Stulik, Tuscon, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/561,593

(22) Filed: Sep. 5, 2019

(65) Prior Publication Data
US 2021/0074629 A1 Mar. 11, 2021

(51) Int. Cl.
*H01L 21/00* (2006.01)
*H01L 23/522* (2006.01)
*H01G 15/00* (2013.01)
*H01G 4/06* (2006.01)

(52) U.S. Cl.
CPC ......... *H01L 23/5223* (2013.01); *H01G 15/00* (2013.01); *H01L 23/5226* (2013.01); *H01G 4/06* (2013.01)

(58) Field of Classification Search
CPC ... H01L 23/5223; H01L 23/5226; H01G 5/00; H01G 4/06
See application file for complete search history.

(56) References Cited

U.S. PATENT DOCUMENTS

| | | | | |
|---|---|---|---|---|
| 6,777,777 B1* | 8/2004 | Kar-Roy | ............. | H01L 23/5223 257/310 |
| 2002/0192919 A1* | 12/2002 | Bothra | ..................... | H01L 28/60 438/381 |
| 2005/0121744 A1* | 6/2005 | Chang | ................. | H01L 23/5223 257/532 |
| 2009/0096062 A1* | 4/2009 | Bang | .................... | H01L 23/5223 257/532 |

\* cited by examiner

*Primary Examiner* — Richard A Booth
(74) *Attorney, Agent, or Firm* — Jacqueline J. Garner; Charles A. Brill; Frank D. Cimino

(57) ABSTRACT

An integrated circuit (IC) includes a substrate and a first capacitor on the substrate. The first capacitor has a first width. A first dielectric layer is provided on a side of the first capacitor opposite the substrate. Further, a second capacitor is present on a side of the first dielectric layer opposite the first capacitor. The second capacitor has a second width that is smaller than the first width. The IC also has a second dielectric layer and a first metal layer. The second dielectric layer is on a side of the second capacitor opposite the first dielectric layer. The first metal layer is on a side of the second dielectric layer opposite the second capacitor.

14 Claims, 7 Drawing Sheets

STACKED CAPACITOR

BACKGROUND

Capacitors are electrical circuit components used in a multitude of circuit applications. Integrated circuits often include capacitors as well as transistors, diodes, and other circuit components.

SUMMARY

In one example, an integrated circuit (IC) includes a substrate and a first capacitor on the substrate. The first capacitor has a first width. A first dielectric layer is provided on a side of the first capacitor opposite the substrate. Further, a second capacitor is present on a side of the first dielectric layer opposite the first capacitor. The second capacitor has a second width that is smaller than the first width. The IC also has a second dielectric layer and a first metal layer. The second dielectric layer is on a side of the second capacitor opposite the first dielectric layer. The first metal layer is on a side of the second dielectric layer opposite the second capacitor.

BRIEF DESCRIPTION OF THE DRAWINGS

For a detailed description of various examples, reference will now be made to the accompanying drawings in which.

DETAILED DESCRIPTION

Challenges in providing a capacitor on an integrated circuit (IC) include one or more of the following: capacitance density, area, voltage coefficient and mismatch, manufacturing margin, and reliability. Some applications benefit from larger capacitance density (measured in units of, for example, femto-Farads per square micrometer), while also reducing the footprint area of the capacitor and reducing the voltage coefficient and mismatch. The examples described herein provide a stacked capacitor arrangement within an integrated circuit that achieves higher capacitance density (than for a single capacitor having the same capacitance) while also occupying a smaller area within the IC and having a smaller voltage coefficient and mismatch.

Figure 1:
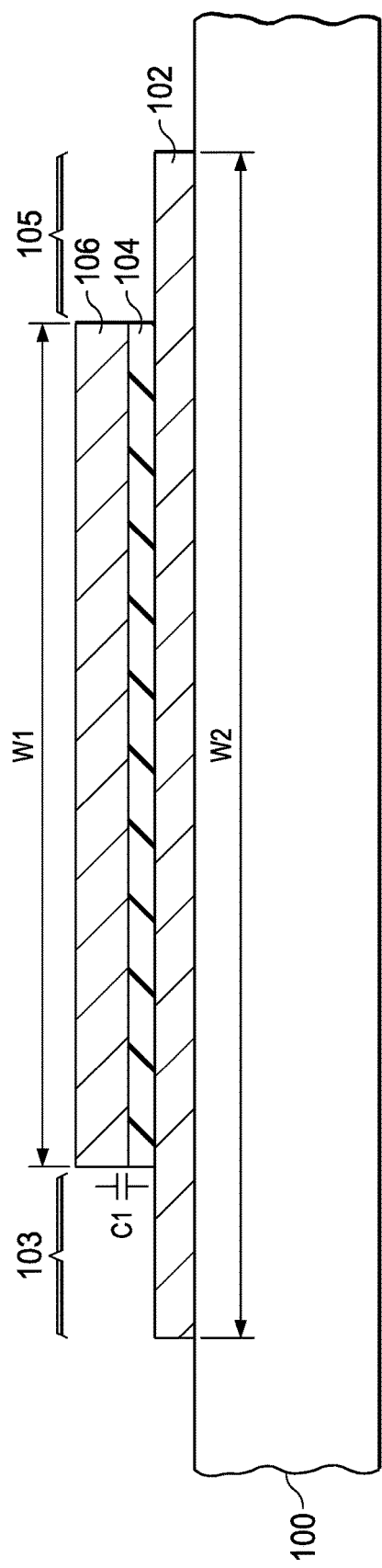
FIG. 1 illustrates an example of a portion of a process for fabricating a stacked capacitor in an integrated circuit.

FIGS. 1-5 show the sequence of process operations to fabricate a stacked capacitor in accordance with one example. FIG. 6 illustrates the completed stacked capacitor arrangement. FIG. 1 illustrates a substrate 100 (e.g., a semiconductor substrate) on which a conductive layer 102 is formed. Conductive layer 102 may comprise, for example, metal or polysilicon. One or more additional conductive layers may be provided below conductive layer 102. Conductive layer 102 may comprise aluminum (Al), silicided polycrystalline silicon (poly silicon), or other type of metal. A dielectric layer 104 is formed on top of conductive layer 102 opposite the substrate 100. The dielectric layer 104 may comprise silicon nitride, silicon dioxide or a stack of such dielectrics or another type of dielectric material. Another metal layer 106 is formed on top of dielectric layer 104 opposite conductive layer 102. Metal layer 106 may comprise titanium nitride or another type of conductive material. The combination of layers 102 and 106 separated by dielectric layer 104 forms a capacitor denoted as C1.

The width W1 of metal layer 106 is generally equal to the width of the dielectric layer 104. The width of the conductive layer 102 is W2. In the example shown, W2 is greater than W1, resulting in exposed areas 103 and 105 of the conductive layer 102 not covered by either the dielectric layer 104 or metal layer 106. These exposed areas 103, 105 are used, as will be described below, for conductive vias to connect to conductive layer 102 from higher level layers.

Figure 2:
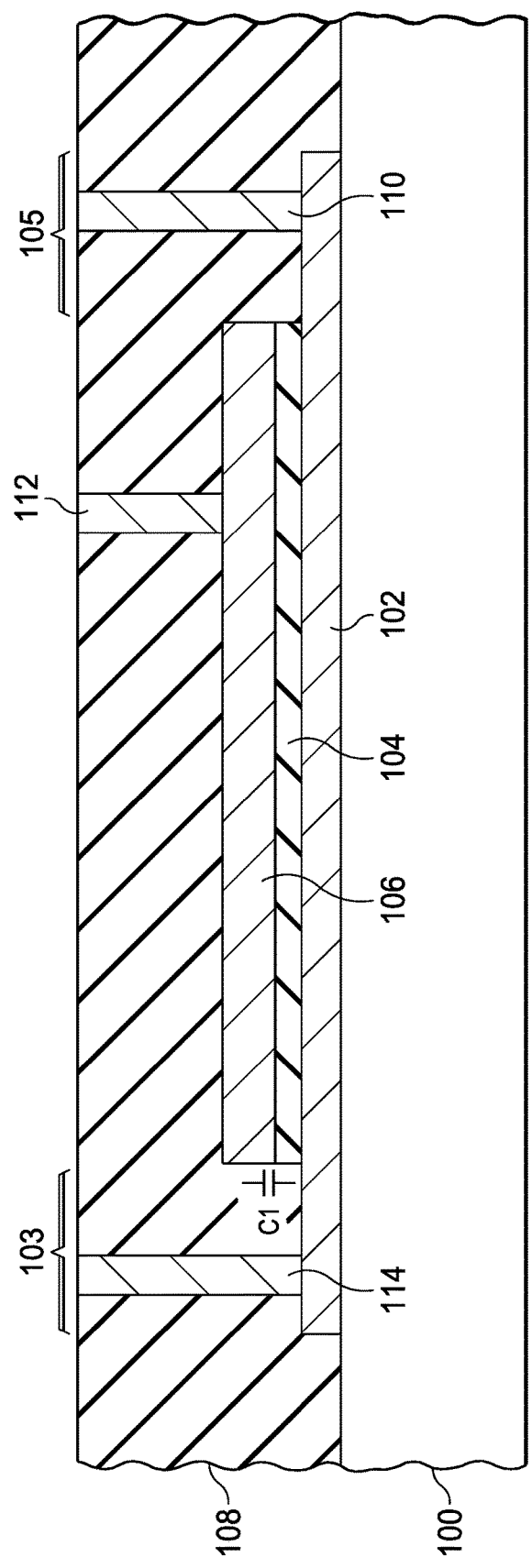
FIG. 2 illustrates an additional operation of the process for fabricating the stacked capacitor.

FIG. 2 shows the same layers as in FIG. 1, but also shows that a dielectric layer 108 has been deposited on top of the structure of FIG. 1. The dielectric layer 108 may comprise silicon dioxide, silicon nitride, silicon oxynitride or another type of dielectric material. Vias 110, 112, and 114 are etched through the dielectric layer 108 and coated with a conductive material (e.g., metal). Vias 110 and 114 connect to layer 102 in the exposed areas 105 and 103, respectively, and via 112 connects to layer 106. Only one via 112 to metal layer 106 is shown in the implementation of FIG. 2, but more than one via can be connected to metal layer 106 in other implementations.

Figure 3:
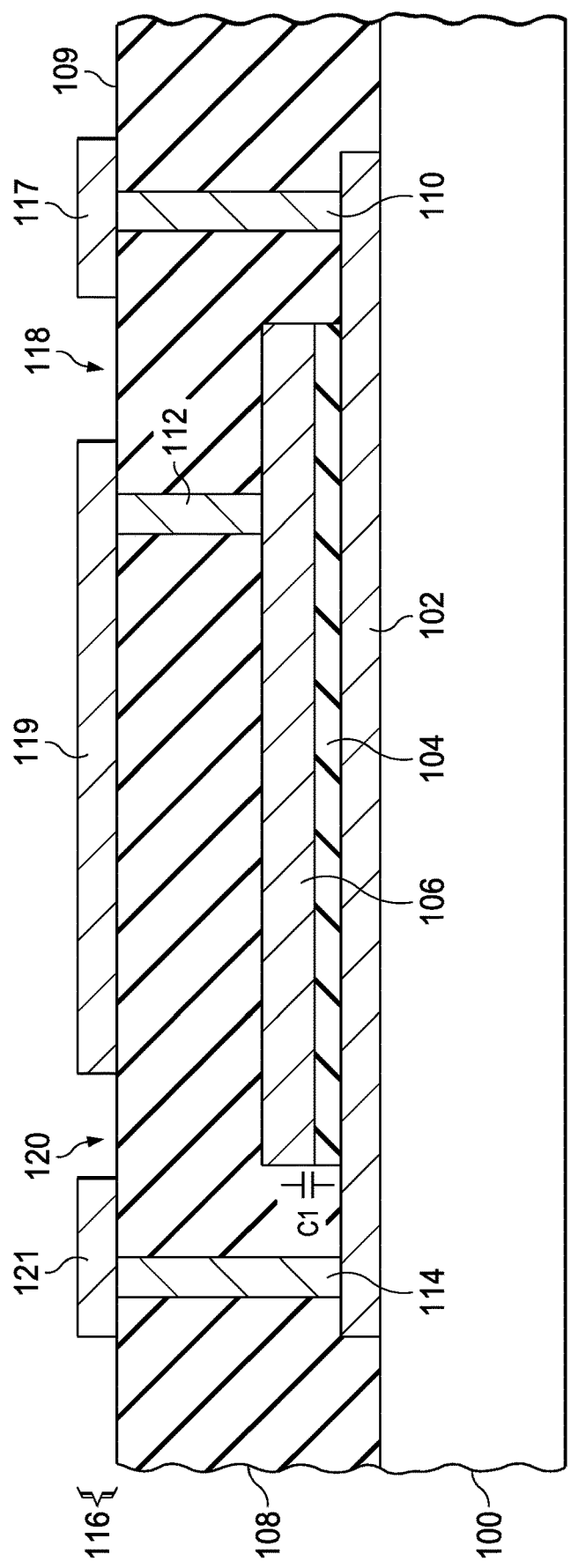
FIG. 3 illustrates yet a further operation of the process for fabricating the stacked capacitor.

FIG. 3 shows the same elements as FIG. 2, but also illustrates that a metal layer 116 is deposited on the surface 109 of dielectric layer 108. The metal layer 116 may comprise aluminum, titanium-nitride (Al TiN) or another of metal. Further, cavities 118 and 120 are etched into metal layer 116 all of the way through to surface 109 of dielectric layer 108, resulting in three separate portions 117, 119, and 121 of metal layer 116. Metal layer portion 117 is electrically connected to conductive layer 102 by way of via 110. Similarly, metal layer portion 121 is electrically connected to conductive layer 102 by way of via 114. Metal layer portion 119 is electrically connected to metal layer 106 by way of via 112. As such, outer metal layer portions 117 and 121 are electrically connected to conductive layer 102, while inner metal layer portion 119 is electrically connected to metal layer 106.

Figure 4:
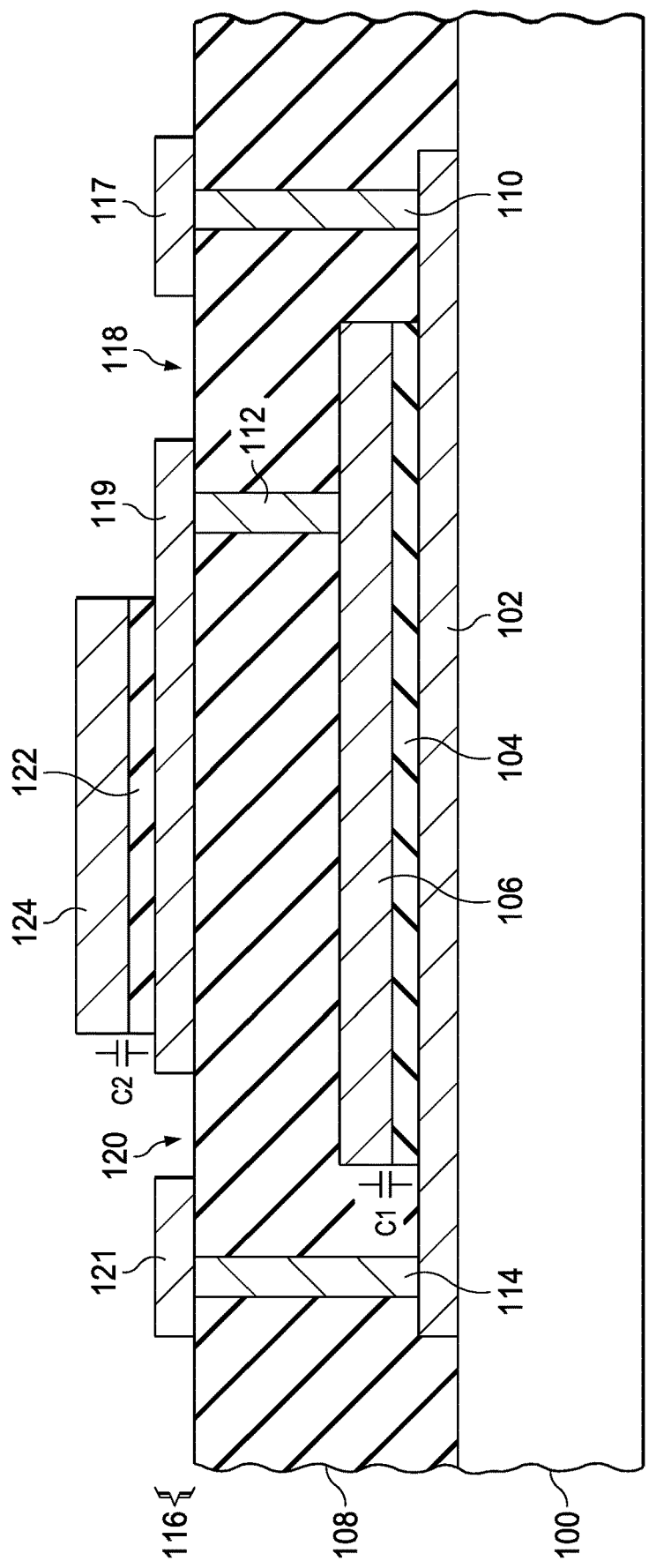
FIG. 4 illustrates an additional operation of the process for fabricating the stacked capacitor.

FIG. 4 shows the same elements as FIG. 3, but also illustrates two additional layers. A dielectric layer 122 is formed on metal layer portion 119 opposite dielectric layer 108. Dielectric layer 122 may comprise the same (or different) dielectric material as dielectric layer 104. Metal layer 124 is formed on dielectric layer 122 opposite metal layer portion 119. Metal layer 124 may comprise titanium nitride or another type of conductive material. The combination of metal layer 124 and metal layer portion 119 separated by dielectric layer 122 forms a capacitor denoted as C2. The upper plate of C1 (i.e., metal layer 106) is electrically connected to the lower plate of C2 (i.e., metal layer portion 119) by way of via 112.

Figure 5:
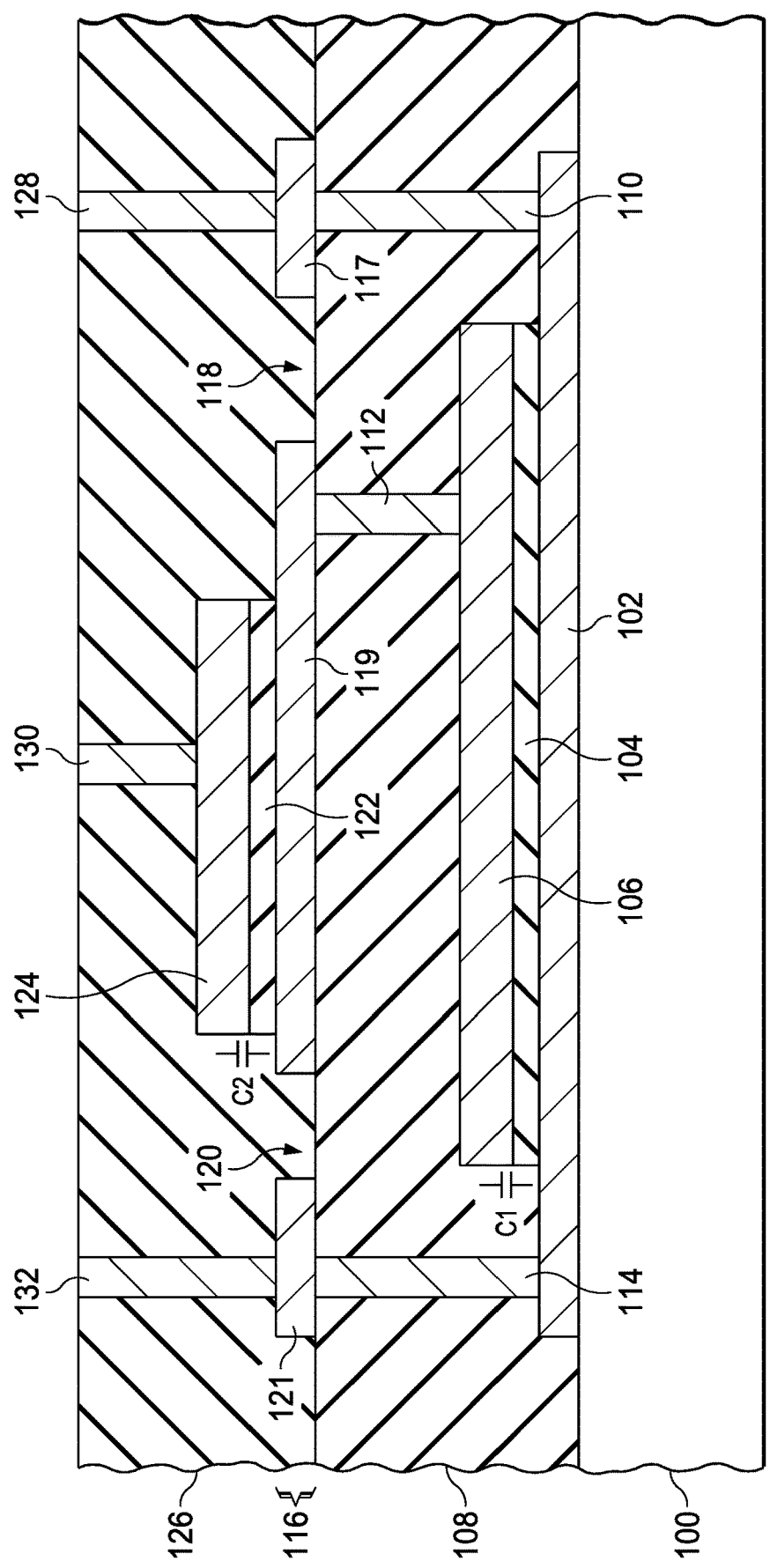
FIG. 5 illustrates an additional operation of the process for fabricating the stacked capacitor.
Figure 6:
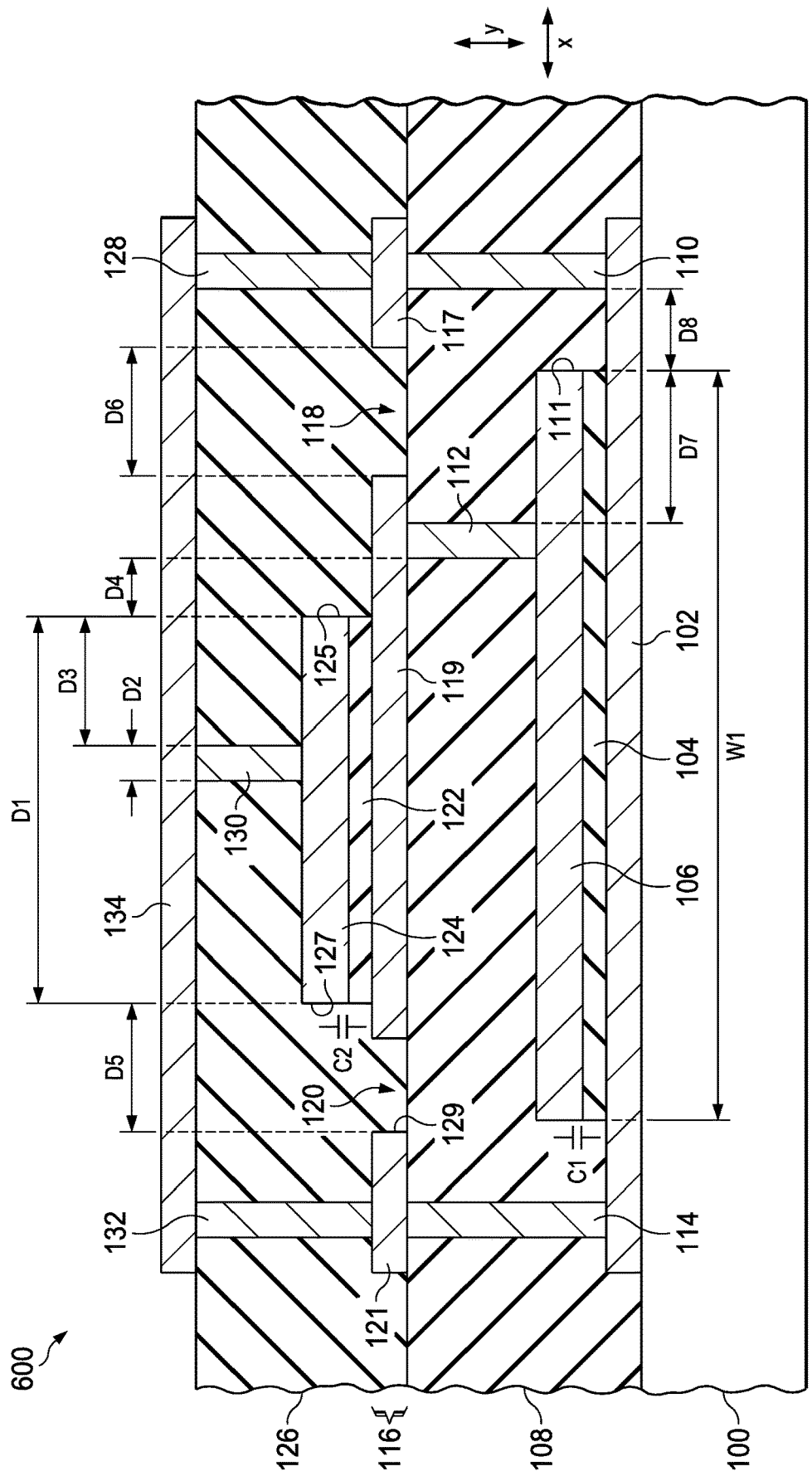
FIG. 6 illustrates the final operation of the process for fabricating the stacked capacitor, and thus the complete stacked capacitor structure.

FIG. 5 shows the same elements as FIG. 4, but FIG. 5 also illustrates that a dielectric layer 126 is included as well. The dielectric layer 126 flows into the cavities 118 and 120, covers the metal layer 116, and the capacitive structure C2 formed by metal layer portion 119, dielectric layer 122, and metal layer 124. Vias 128, 130, and 132 are etched through the dielectric layer 126 and coated with a conductive material (e.g., metal). Vias 128 and 132 connect to layer 116 (at metal layer portions 117 and 121, respectively), and via 130 connects to layer 124. Only one via 130 to metal layer 124 is shown in FIG. 5, but more than one via can be connected to metal layer 124 in other implementations.

Figure 7:
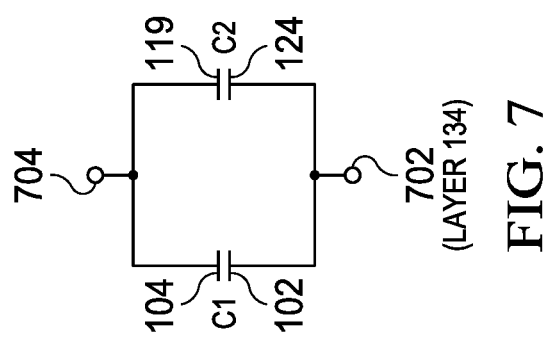
FIG. 7 shows the electrical circuit model of the stacked capacitor in the example of FIG. 6.

FIG. 6 shows a complete stacked capacitor 600. The structure in FIG. 6 includes the same elements as in FIG. 6 as well as a metal layer 134 formed on the dielectric layer 126 and over the tops of the vias 128, 130, and 132. Metal layer 134 comprises aluminum or another suitable metal. By way of via 130, metal layer 134 is electrically connected to metal layer 124, which comprises a first plate of capacitor C2. Further, by way of the vias 128 and 132, metal layer portions 117 and 121, and vias 110 and 114, metal layer 134 is electrically connected to conductive layer 102, which itself comprises a first plate of capacitor C1. As such, the second plate of C2 (metal layer 124) is electrically connected to the first plate of C1 (layer 102). Further, the first plate of C2 (metal layer portion 119) is electrically connected by way of via 112 to the second plate of C1 (metal layer 104). Capacitors C1 and C2 are thus connected in parallel, as the circuit model of FIG. 7 illustrates. The stacked arrangement of parallel-connected capacitors C1 and C2 results in a two-terminal capacitive device. One terminal is terminal 701 and may be taken from metal layer 134. The other terminal is terminal 703 which may be provided by metal layer portion 119. In one implementation, terminals 701 and 703 are exposed to input/output (I/O) pads from the integrated circuit following a packaging process, so that the stacked capacitor is accessible from circuitry outside the IC. In another implementation, the terminals 701 and 703 of the stacked capacitor are not made accessible to external circuitry, and the stacked capacitor is only connected to other internal components within the IC.

FIG. 6 also shows dimensions D1-D8. D1 represents the width of the metal layer 124. Dielectric layer 122 has the same width D1 as metal layer 124 in this example. D2 represents the width of via 130. The other vias 110, 112, 114, 128, and 132 also may have the same (or different) width D2. D3 represents the distance between a side of via D3 and the side 125 of metal layer 124. D4 represents the distance between side 125 and a side of via 112 as shown. D5 represents the distance between the opposite side 127 of metal layer 124 and the facing edge 129 of metal layer portion 121. D6 represents the width of cavity 118, that is the distance between metal layer portions 117 and 119. Cavity 120 may have the same width D6. D7 represents the distance between a side of via 112 and the side 111 of metal layer 106. D8 represents the distance between side 111 and via 110. Table I below shows an example set of ranges for D1-D8 as well as one specific example for each distance.

TABLE I

| DISTANCE | EXAMPLE RANGE (µ) | EXAMPLE (µ) |
| --- | --- | --- |
| D1 | Greater than or equal to 4 | 4 |
| D2 | ±0.1 | 0.24 |
| D3 | 0.2-1.5 | 1 |
| D4 | 0.4-1.5 | 1.5 |
| D5 | 0.4-1 | 0.4 |
| D6 | 0.25-0.5 | 0.35 |
| D7 | 0.2-1.5 | 1 |
| D8 | 0.25-1.25 | 1 |

Distance D1 (width of metal layer 124) is smaller than W1 (width of metal layer 104). That D1 is smaller than W1, in part, permits the metal layer 134 to be electrically connected to conductive layer 102 without shorting to metal layer portion 119 of capacitor C2. The cavities 118 and 120 are filled with dielectric material and thus also help to prevent metal layer portion 119 of capacitor C2 from being shorted to layers 134 or 102.

Figure 8:
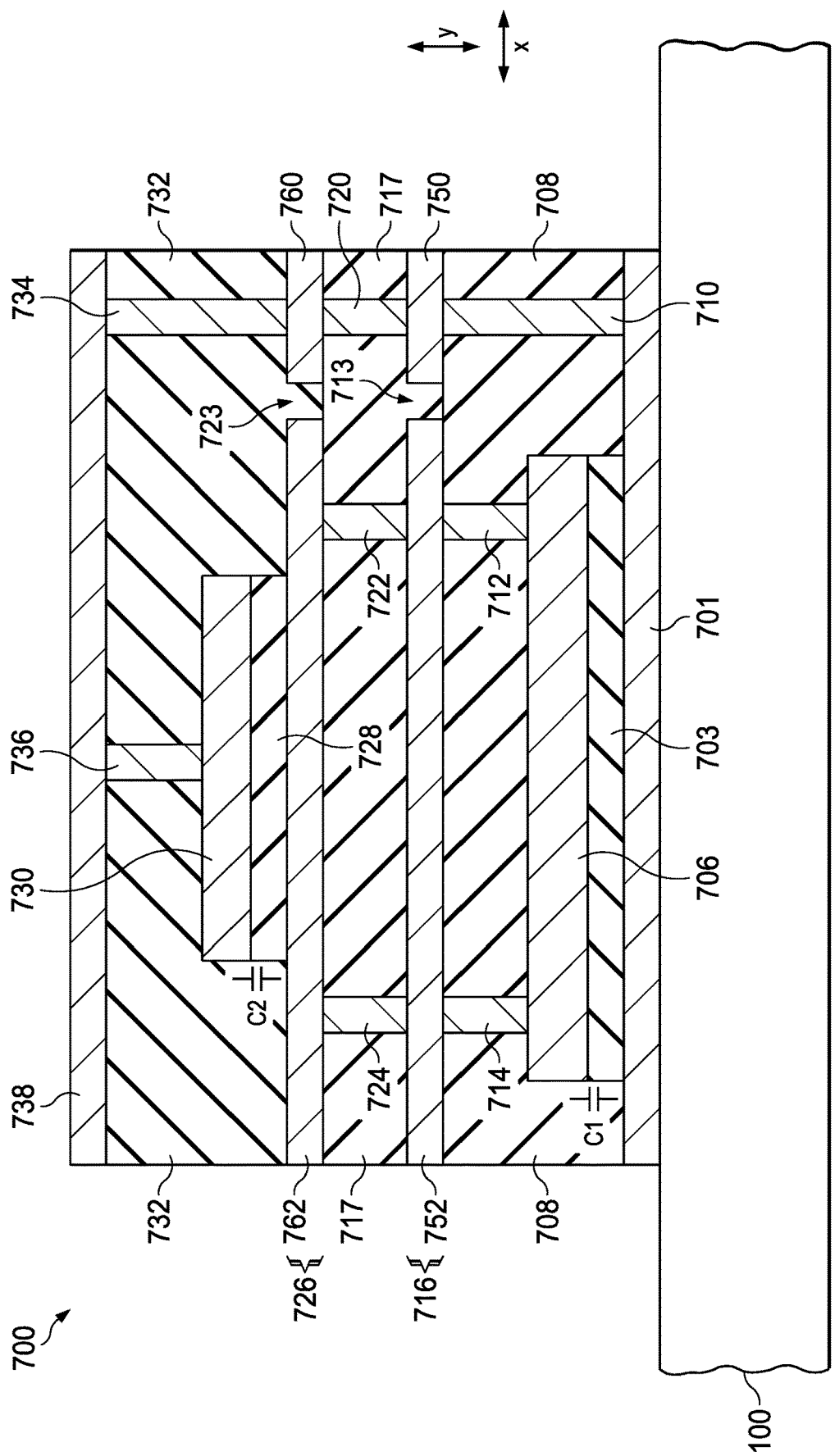
FIG. 8 shows another example of a stacked capacitor formed within an integrated circuit.

FIG. 8 shows another example of a stacked capacitor 700, similar to that of FIG. 6 with an additional metal layer between the capacitors C1 and C2. The stacked capacitor 700 of FIG. 8 includes a polycrystalline silicon ("polysilicon") layer 702 (or a metal layer), dielectric layer 704, metal layer 706 (e.g., titanium nitride), metal layers 716 and 726, dielectric layers 708, 717, and 732, dielectric layer 728, metal layer 730 (e.g., titanium nitride), and metal layer 738. Metal layers 706 and 716 are separated from each other by dielectric layer 708. A cavity 713 is etched in metal layer 716 thereby dividing metal layer 716 into metal layer portions 750 and 752. Metal layer portion 750 is electrically connected to layer 702 by way of via 710, and metal layer portion 752 is electrically connected to metal layer 706 by way of vias 712 and 714. In another example, metal layer portion 752 is electrically connected to metal layer 706 by way of a single via.

Metal layers 726 and 716 are separated from each other by dielectric layer 717. A cavity 723 is etched in metal layer 726 thereby dividing metal layer 726 into metal layer portions 760 and 762. Metal layer portion 760 is electrically connected to metal layer portion 750 by way of via 720, and metal layer portion 762 is electrically connected to metal layer portion 752 by way of vias 722 and 724. Metal layers 738 and 726 are separated from each other by dielectric layer 732. Metal layer 738 is electrically connected to metal layer portion 760 by way of via 734. Metal layer 738 is also electrically connected to metal layer 730 by way of via 736.

Capacitors C1 and C2 are connected in parallel in the example of FIG. 8 similar to that described above regarding FIG. 6. A first plate of C1 (metal layer 706) is electrically connected to a first plate of C2 (metal layer portion 762) by way of vias 722, 724, metal layer portion 752, and vias 712 and 714. The second plate of C1 (layer 702) is connected to the second plate of C2 (metal layer 730) by way of the stacked arranged of via 708, metal layer portion 750, via 720, metal layer portion 760, and via 734.

The example of FIG. 8 has an additional metal layer 716 (relative to the example of FIG. 6). More than one additional layer relative to the example of FIG. 6 may be included as well. The additional metal layer(s) are useful so that, not only can two adjacent capacitors be stacked in parallel (C1 and C2), but also a vertically-stacked set of capacitors can be formed between, for example, C1 and additional capacitor laterally located elsewhere on the die (not shown in FIG. 8).

In the examples of FIGS. 6 and 8, capacitors C1 and C2 are stacked vertically (along the y-axis shown in FIGS. 6 and 8). By stacking multiple (two or more) capacitors vertically, the stacked arrangement of capacitors occupies less area on the substrate than if the capacitors were formed adjacent one another along the x-axis (i.e., side by side). As such, the capacitance density of the resulting stacked capacitors is higher than for a single capacitor of the same capacitance value, and higher than for two side-by-side capacitors connected in parallel.

Figure 9:
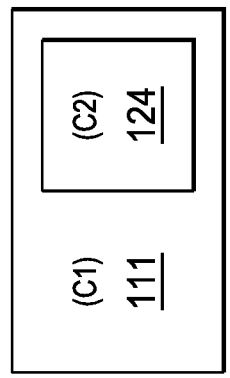
FIG. 9 shows a top-down view of the stacked capacitors.

FIG. 9 illustrates a top-down view of the stacked capacitor 600. Metal layer 124 of capacitor C2 is shown in relation to metal layer 111 of capacitor C1. As can be seen, the area (footprint) defined by metal layer 124 is smaller than the area (footprint) defined by metal layer 111 along a y-axis from between layers 134 and 102. Further, the space occupied by metal layer 124 lies within the space occupied by metal layer 111 (albeit the two metal layers 111 and 124 are spaced apart vertically as shown in the prior figures). The same geometric relationship in FIG. 8 of capacitor C1 (metal layer 706) and capacitor C2 (metal layer 730) is true as well.

Connecting two stacked capacitors in an anti-parallel arrangement (i.e., top plate of C1 connected to bottom plate of C2 and bottom plate of C1 connected to top plate of C2) results in cancellation of the linear component of the Voltage Coefficients of Capacitance (VCC). This is advantageous in designs such as data converters as it minimizes errors in the output. Mismatch between capacitors is also of concern in various circuits. When two capacitors are stacked, the combined mismatch may result in a function of the weighted averages of the individual mismatches, which is lower than the mismatch of the individual capacitors.

Modifications are possible in the described embodiments, and other embodiments are possible, within the scope of the claims.

What is claimed is:

1. An integrated circuit (IC), comprising:
   a substrate;
   a first capacitor on the substrate, the first capacitor having a first width;
   a first dielectric layer on a side of the first capacitor opposite the substrate;
   a second capacitor on a side of the first dielectric layer opposite the first capacitor, the second capacitor having a second width, the second width is smaller than the first width, wherein the IC is free of electrical connections through the first dielectric layer between the first capacitor and the second capacitor directly under the second capacitor;
   a second dielectric layer on a side of the second capacitor opposite the first dielectric layer; and
   a first metal layer on a side of the second dielectric layer opposite the second capacitor.

2. The IC of claim 1, wherein the first metal layer is electrically connected to the first capacitor.

3. The IC of claim 1, wherein the first capacitor comprises a second metal layer formed on the substrate, the second metal layer electrically connected to the first metal layer by way of a via.

4. The IC of claim 1, wherein the first capacitor comprises a polysilicon layer formed on the substrate, the polysilicon layer electrically connected to the first metal layer by way of a via.

5. The IC of claim 1, further comprising a third metal layer formed on the side of the first dielectric layer opposite the first capacitor, the third metal layer having a first cavity and a second cavity, and the third metal layer having a first metal layer portion between the first and second cavities, and wherein the first metal layer portion comprises a plate of the second capacitor.

6. The IC of claim 4, wherein the first metal layer portion is electrically connected to the first capacitor by a via.

7. The IC of claim 5, wherein:
   the third metal layer comprises a second metal layer portion and a third metal layer portion;
   the second metal layer portion separated from the first metal portion by the first cavity;
   the third metal layer portion separated from the first metal portion by the second cavity;
   the first metal layer is electrically connected to the second metal layer portion by a first via, and the first metal layer is electrically connected to the third metal layer portion by a second via; and
   the first capacitor has a second metal layer, and the second metal layer portion is electrically connected to the second metal layer by a third via, and the third metal layer portion is electrically connected to the second metal layer by a fourth via.

8. The IC of claim 1, wherein:
   the first capacitor defines a first area;
   the second capacitor defines a second area; and
   the first area is larger than the second area.

9. The IC of claim 5, wherein the first capacitor has a second metal layer, and further comprising a fourth metal layer disposed between the second and third metal layers.

10. The IC of claim 1, wherein the first capacitor has a second metal layer, and wherein a footprint of the second capacitor lies within a footprint of the first capacitor along an axis from the first metal layer to the second metal layer.

11. An integrated circuit (IC), comprising:
    a substrate;
    a first capacitor on the substrate;
    a first dielectric layer on a side of the first capacitor opposite the substrate;
    a second capacitor on a side of the first dielectric layer opposite the first capacitor, wherein the IC is free of electrical connections through the first dielectric layer between the first capacitor and the second capacitor directly under the second capacitor;
    a second dielectric layer on a side of the second capacitor opposite the first dielectric layer; and
    a first metal layer on a side of the second dielectric layer opposite the second capacitor, the first metal layer electrically connected to the first capacitor by way of a via without being electrically connected to the second capacitor.

12. The IC of claim 11, wherein the first metal layer is electrically connected to the first capacitor by way of a via.

13. The IC of claim 11, wherein the first capacitor has a first width, the second capacitor has a second width, and the second width is smaller than the first width.

14. The IC of claim 11, further comprising a third metal layer formed on the side of the first dielectric layer opposite the first capacitor, the third metal layer having a first cavity and a second cavity, and the third metal layer having a first metal layer portion between the first and second cavities, and wherein the first metal layer portion comprises a plate of the second capacitor.

* * * * *